(12) United States Patent
da Silva et al.

(10) Patent No.: US 10,244,808 B2
(45) Date of Patent: Apr. 2, 2019

(54) THREE-DIMENSIONAL ELECTRIC FIELD SENSOR IN HARD HATS

(71) Applicant: COPEL DISTRIBUIÇÃO S/A, Curitiba (BR)

(72) Inventors: Alexandre Muller da Silva, Cachoeirinha (BR); Andre Luis Muller da Silva, Cachoeirinha (BR); Paulo Moreira de Souza, Patco Branco (BR); Vera Lucia Pietruk Zarpellon, Curitiba (BR)

(73) Assignee: COPEL DISTRIBUIÇÃO S/A, Curitiba-PR (BR)

( * ) Notice: Subject to any disclaimer, the term of this patent is extended or adjusted under 35 U.S.C. 154(b) by 74 days.

(21) Appl. No.: 15/663,106

(22) Filed: Jul. 28, 2017

(65) Prior Publication Data

US 2019/0014847 A1   Jan. 17, 2019

(30) Foreign Application Priority Data

Jul. 12, 2017   (BR) ...................... 10 2017 014943 9

(51) Int. Cl.
| | | |
|---|---|---|
| *G01R 31/02* | (2006.01) | |
| *A42B 3/04* | (2006.01) | |
| *G01R 19/00* | (2006.01) | |
| *G01R 31/00* | (2006.01) | |
| *H02G 1/02* | (2006.01) | |
| *G01R 29/14* | (2006.01) | |

(52) U.S. Cl.
CPC .......... *A42B 3/046* (2013.01); *G01R 19/0092* (2013.01); *G01R 31/001* (2013.01); *G01R 29/14* (2013.01); *H02G 1/02* (2013.01)

(58) Field of Classification Search
CPC ............ G01R 19/0092; G01R 29/0842; G01R 31/001; G01R 19/0046; G01R 29/0878; G01R 29/12; G01R 19/00; G08B 3/10; G08B 21/0213; G08B 5/36; G08B 21/182
See application file for complete search history.

(56) References Cited

U.S. PATENT DOCUMENTS

| | | | | |
|---|---|---|---|---|
| 6,329,924 B1 * | 12/2001 | McNulty | ............ | G01R 29/0857 340/552 |
| 8,786,447 B1 * | 7/2014 | Wise | .................. | G01R 29/0857 340/573.4 |
| 2018/0160761 A1 * | 6/2018 | Al Kuwari | ............. | A42B 3/286 |

FOREIGN PATENT DOCUMENTS

BR      PI1100471-1      7/2015

* cited by examiner

*Primary Examiner* — Jermele M Hollington
*Assistant Examiner* — Raul J Rios Russo
(74) *Attorney, Agent, or Firm* — B. Aaron Schulman, Esq.; Stites & Harbison, PLLC

(57) ABSTRACT

The present invention provides a three-dimensional electric field sensor for hard hats, the sensor having a stand-alone structure and constructed of polymeric and hydrophobic materials, and intended for three-dimensional measurement of the electric field in energized powerlines by its disposition on hard hats. The three-dimensional sensor of the present invention has an outer shell with a base attaching to the hard hat and a cover attaching to the base, an inner shell functioning as a capacitive sensor as well as protecting an internal electronic board, a battery and adapter assembly as a power supply, and a warning buzzer, in order to provide complete optimization procedures to alert electric utility linemen of exceedingly close proximity to medium voltage conductors in powerlines.

4 Claims, 10 Drawing Sheets

THREE-DIMENSIONAL ELECTRIC FIELD SENSOR IN HARD HATS

The present patent of invention relates to electric sensors in general, more specifically to a three-dimensional electric field sensor in hard hats which, according to the general features thereof, provides, as its basic principle, a three-dimensional electric field sensor in a specific, stand-alone structure of polymeric and hydrophobic type intended for three-dimensional measurement of the electric field in energized powerlines through its disposition on hard hats and based on an outer shell (base/hard hat and cover/shell), an inner shell, an electronic board, a battery and a buzzer, in order to provide, in an extremely practical, safe and accurate manner, complete optimization procedures to alert electric utility linemen wearing hard hats to the exceedingly close proximity to medium voltage conductors in powerlines and being based on a three-dimensional electric field sensor of high strength, safety and versatility.

With a specific design and format and easy access for better adaptation and user safety, convenience features in handling and functionality, very affordable and, due to its general characteristics and dimensions, easily adaptable to a variety of hard hats, locations and users in general, as well as to several different types of powerlines, regardless of the characteristics that they may present.

More specifically, the present patent of invention is based on an improvement over previously filed patent application PI 1100471-1, from Feb. 4, 2011, "Three-dimensional electric field sensor fitted to a hard hat", by the same applicant and patent holder COPEL DISTRIBUIÇÃO S/A, so as to provide thereof a set of technical solutions for a range of existing technical problems, i.e., adding novelty and inventive activity to the previous three-dimensional electric field sensor.

In an extensive review of the literature in order to provide the current state of the art of three-dimensional electric field sensors in general, object of the present patent of invention, relevant documents from the prior art related to the specific object claimed in the present invention were not described, namely, three-dimensional electric field sensors fitted to hard hats and intended to alert users to the exceedingly close proximity to medium voltage conductors in powerlines.

Thus, the overall design of this present three-dimensional electric field sensor in hard hats, object of the present patent, is entirely based on its simple and robust structure with a minimum required number of components and extremely simple, safe and optimized operation, combined with fairly practical manufacturing and maintenance procedures so as to generate a practical and efficient three-dimensional electric field sensor that introduces an upgraded capacitive sensor or inner shell as protection for an innovative electronic board and being protected by an outer shell with an upgraded design in polymeric, hydrophobic and flammable material, besides having excellent mechanical and electrical characteristics, and being provided with heat resistance, weather resistance, dielectric resistance and UV protection—anti-UV protection.

The upgraded design of the three-dimensional electric field sensor is now structured in two basic parts: a base or hard hat face and a cover or shell face that fit perfectly together through a tight tongued and grooved mechanism. The height of the cover or shell face was reduced to keep the hard hat's balance when in use on the lineman's head and also to meet the basic objective of commercial competitiveness using less raw material for its elaboration. The structure of the base or hard hat face was adapted to a convex structure at an angle similar to that of the hard hat; sensor is affixed to the hard hat using adhesives and/or adhesive tapes so as to absorb the insert of the cover or shell face.

In this innovative design, the fact that the cover or shell face can be detached from the base or hard hat face allows the removal of the entire three-dimensional electric field sensor since it is completely assembled at the front of the equipment, thus enabling the use of the hard hat as a PPE (Personal Protective Equipment).

In addition, the innovative inner shell or capacitive sensor, disposed on the inside of the cover or shell face and forming a single unit, has the specific function of shielding the innovative electronic board from magnetic and electric field exposure.

It is further emphasized that the three field measuring channels are calibrated to provide the same response for the same field strength, thus making it easier to calculate the distances for any relative movement of the utility lineman in relation to the line. This form of measurement provides more reliability to establish the correlation between electric field and safety distance as it is carried out in conditions very similar to the utility linemen's real working conditions.

The present patent is characterized by combining components and procedures in a differentiated design that meets the various requirements the nature of its use demands, i.e., to alert electric utility linemen to the exceedingly close proximity to medium voltage conductors in powerlines. That concept ensures a three-dimensional electric field sensor of great efficiency, functionality, strength, durability, safety, versatility, accuracy, economy, and hygiene due to the excellent aggregate technical qualities, which provide advantages and improvements in the workplace safety procedures in powerlines and whose general characteristics differ from the other shapes and models widely known in the current state of the art.

The present patent of invention comprises the use of a modern, efficient, safe and functional three-dimensional electric field sensor in hard hats formed by a set of properly incorporated physio-chemical and electromagnetic solutions, forming a complete and differentiated three-dimensional electric field sensor with unique design, great finish details and specific characteristics, which incorporates its own specific polymeric and hydrophobic type structure of high durability and strength, general parallelepipedal shape and containing a properly integrated and symmetrically arranged outer shell to assemble and store the components of the three-dimensional electric field sensor, an inner shell as a capacitive sensor and protective element of the electronic board on the inside of the outer shell, an electronic board as a control element of the three-dimensional electric field sensor, a battery/adapter assembly as a power supply and a DC power supply element for the electronic board, a buzzer as a sound warning generator of the exceedingly close proximity to medium voltage conductors in powerlines, in order to make it possible to form a single, complete and safe assembly, whose shapes and internal and external arrangements enable seamless adaptation to several different types of powerlines and hard hats and the like in general, and specially designed for these purposes.

The present three-dimensional electric field sensor is based on the application of components and processes in a differentiated concept without, however, achieving a high degree of sophistication and complexity, thus making it possible to solve some of the main drawbacks of other shapes and models known in the state of the art and employed in procedures to alert electric linemen to the exceedingly close proximity to medium voltage conductors in powerlines, which are located in an operating range in which are very common the limitations on use and application, low efficiency and performance, accidents of different severities, high insecurity, great wear and fragility, low durability and resistance, low versatility, high inaccuracy, laborious application, high losses, high cost and great waste of time, no ergonomics, low performance, general high volume and weight, little flexibility, high maintenance and complex manufacturing process.

The objectives, advantages and other important characteristics of the patent in question can be more easily understood when read in conjunction with the accompanying drawings, in which.

Figure 1A:
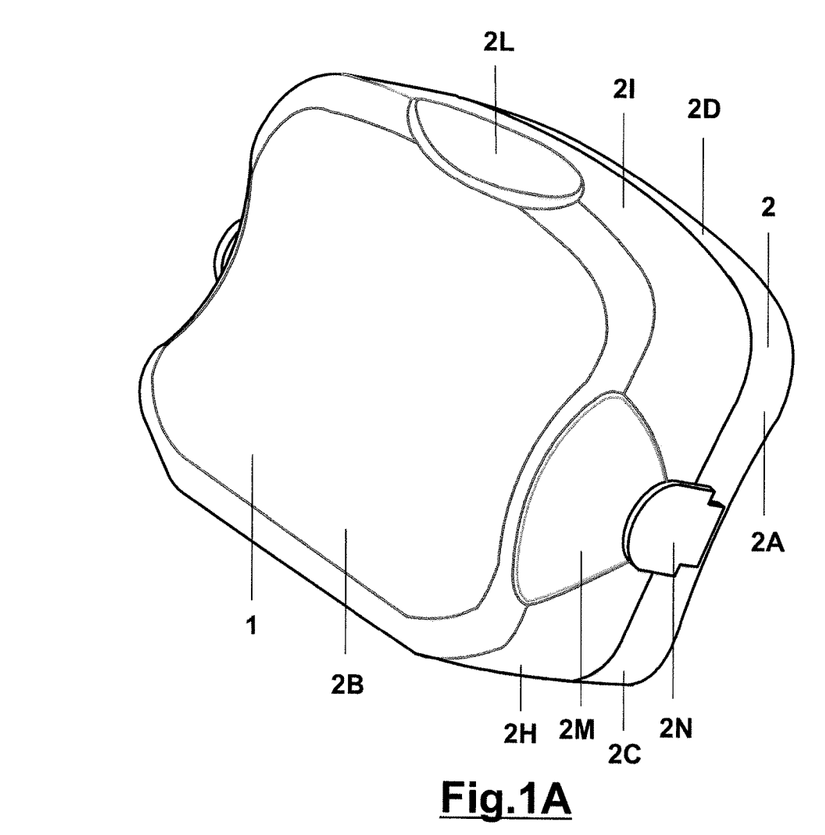
FIG. 1A is a perspective view of the three-dimensional electric field sensor in hard hats.
Figure 1B:
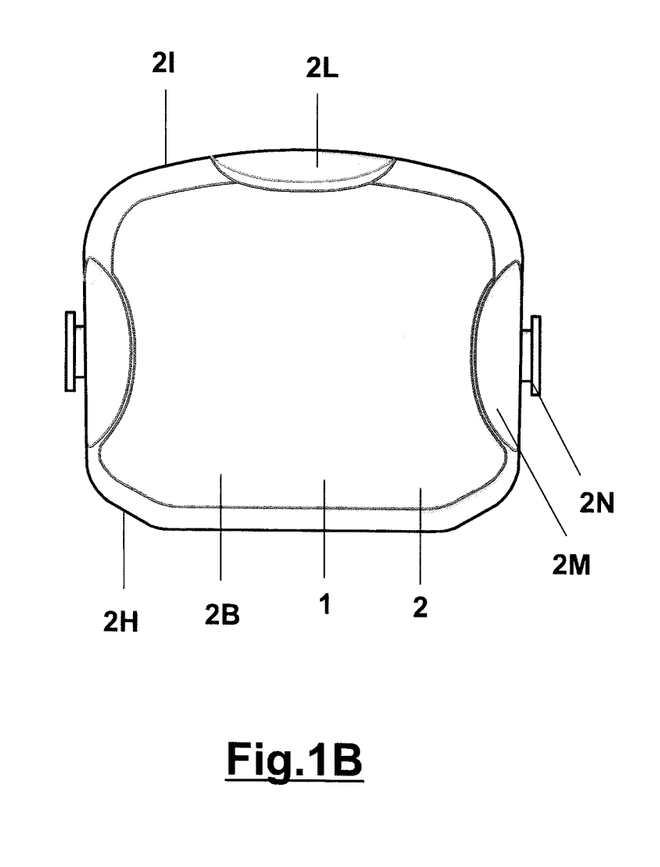
FIG. 1B is a front view of the three-dimensional electric field sensor in hard hats.
Figure 1C:
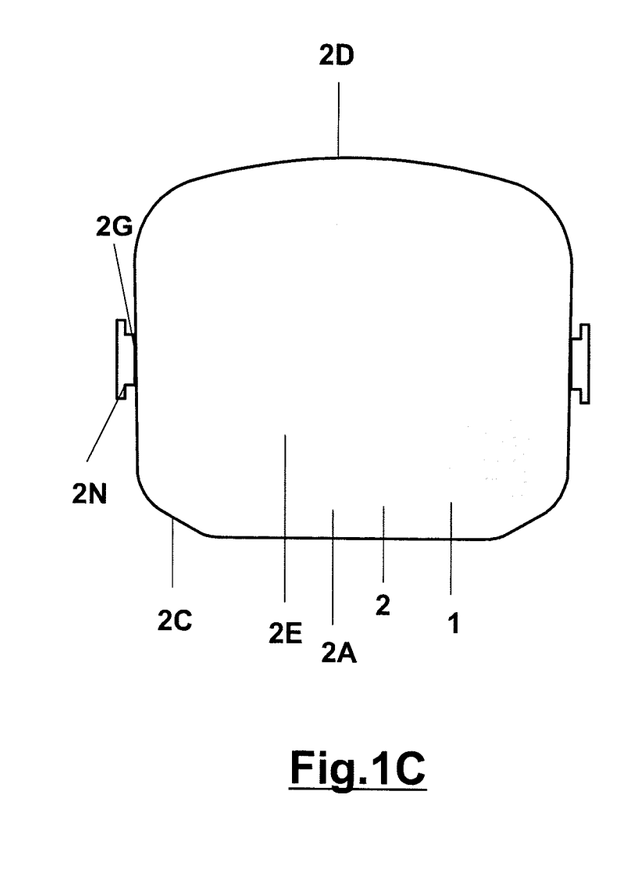
FIG. 1C is a rear view of the three-dimensional electric field sensor in hard hats.
Figure 1D:
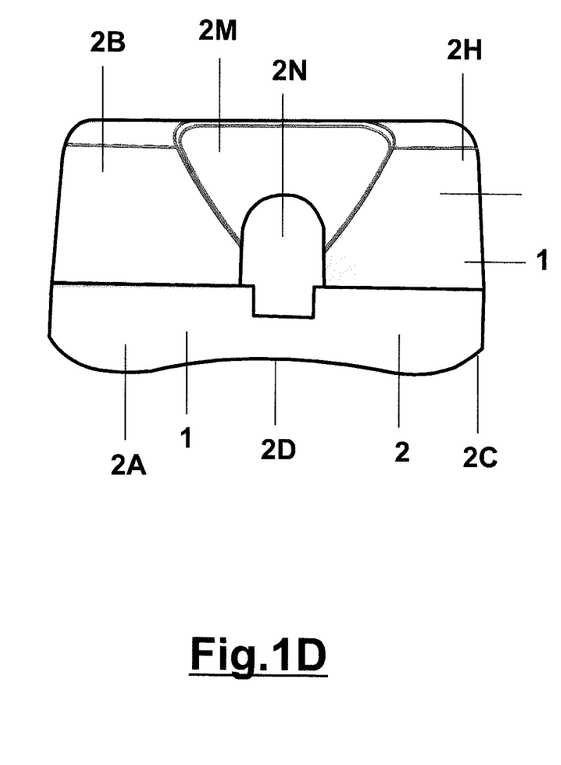
FIG. 1D is a left side view of the three-dimensional electric field sensor in hard hats.
Figure 1E:
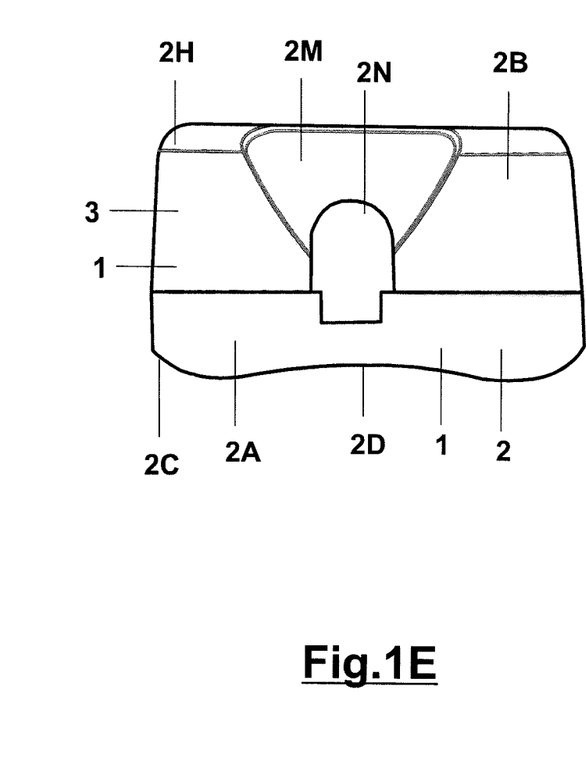
FIG. 1E is a right side view of the three-dimensional electric field sensor in hard hats.
Figure 1F:
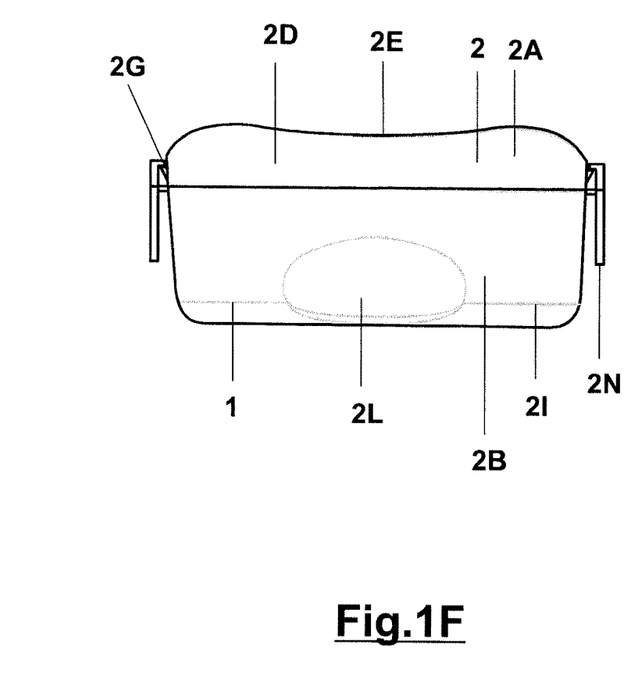
FIG. 1F is a top plan view of the three-dimensional electric field sensor in hard hats.
Figure 1G:
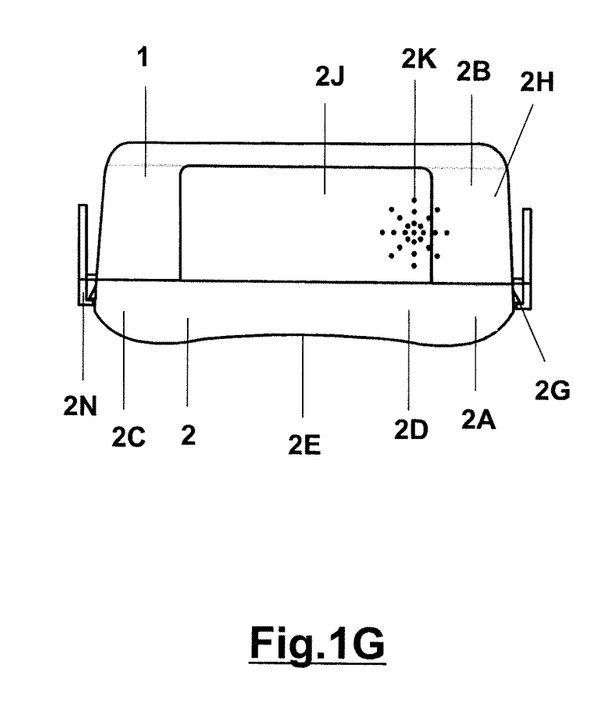
FIG. 1G is a bottom plan view of the three-dimensional electric field sensor in hard hats.

As shown from the accompanying drawings that illustrate and integrate the present descriptive report of the patent of invention "Three-dimensional Electric Field Sensor in Hard Hats", FIG. 1A) shows the three-dimensional electric field sensor in hard hats in general comprising a three-dimensional electric field sensor (1), complete and with specific characteristics, incorporating its own specific polymeric and hydrophobic type structure of parallelepipedal shape, internal and external shapes and arrangements that adapt to various types of powerlines and hard hats (A), and containing a properly integrated and symmetrically arranged outer shell (2) of round-edged parallelepipedal shape symmetrically arranged along the entire length of the three-dimensional electric field sensor (1) and vertical, parallel and symmetrically centered on the front surface of the hard hat (A), and having a base or hard hat face (2A) of parallelepipedal shape and hollow at the front face and vertical, parallel and symmetrically arranged along the entire length of the rear face of the sensor (1) being vertical, parallel and symmetrically centered on the front face of the hard hat (A), and a cover or shell face (2B) of parallelepipedal shape and hollow at the rear face and vertical, parallel and symmetrically arranged along the entire length of rear surface of the base or hard hat face (2A); an inner shell or capacitive sensor (3) of parallelepipedal shape, vertical, parallel and symmetrically arranged on the outer shell (2) inner rear face and having a base (3A) of parallelepipedal shape and hollow on the front face vertical and symmetrically arranged along the entire length of the inner shell or capacitive sensor (3), and a cover (3B) of rectangular shape vertical, parallel and symmetrically arranged along the entire length of the front surface of the base (3A); an electronic board (4) of rectangular shape and vertical, parallel and symmetrically centered on the inside of the inner shell or capacitive sensor (3); a battery/adapter assembly or power supply (5) of parallelepipedal shape vertical, parallel and symmetrically centered on the outer shell (2) inner bottom face and having an adapter (5A) of parallelepipedal shape horizontal, parallel and symmetrically arranged between the underside of the inner shell or capacitive sensor (3) and the outer shell (2) inner bottom surface, and a battery (5B) of cylindrical shape horizontal, parallel and symmetrically fitted at the bottom of the adapter (5A); a buzzer (6) of cylindrical shape horizontal, parallel and symmetrically arranged on the outer shell (2) inner bottom face, between the inner shell or capacitive sensor (3) inner surface and the outer shell (2) inner bottom surface, adjacent to the battery/adapter assembly or power supply (5).

Figure 2A:
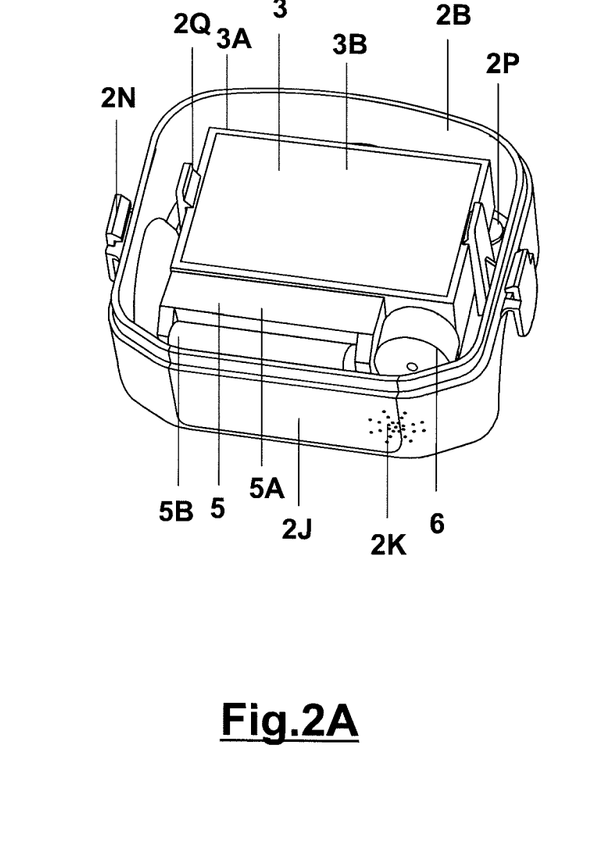
FIG. 2A is a perspective view of the cover of the three-dimensional electric field sensor in hard hats showing the internal components thereof.
Figure 2B:
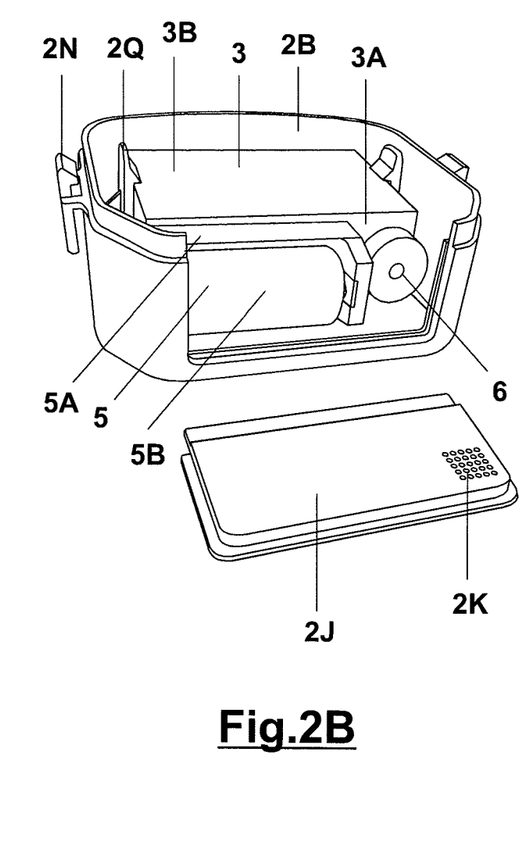
FIG. 2B is a perspective view of the cover of the three-dimensional electric field sensor in hard hats with the small cover open to show the internal components thereof.
Figure 2C:
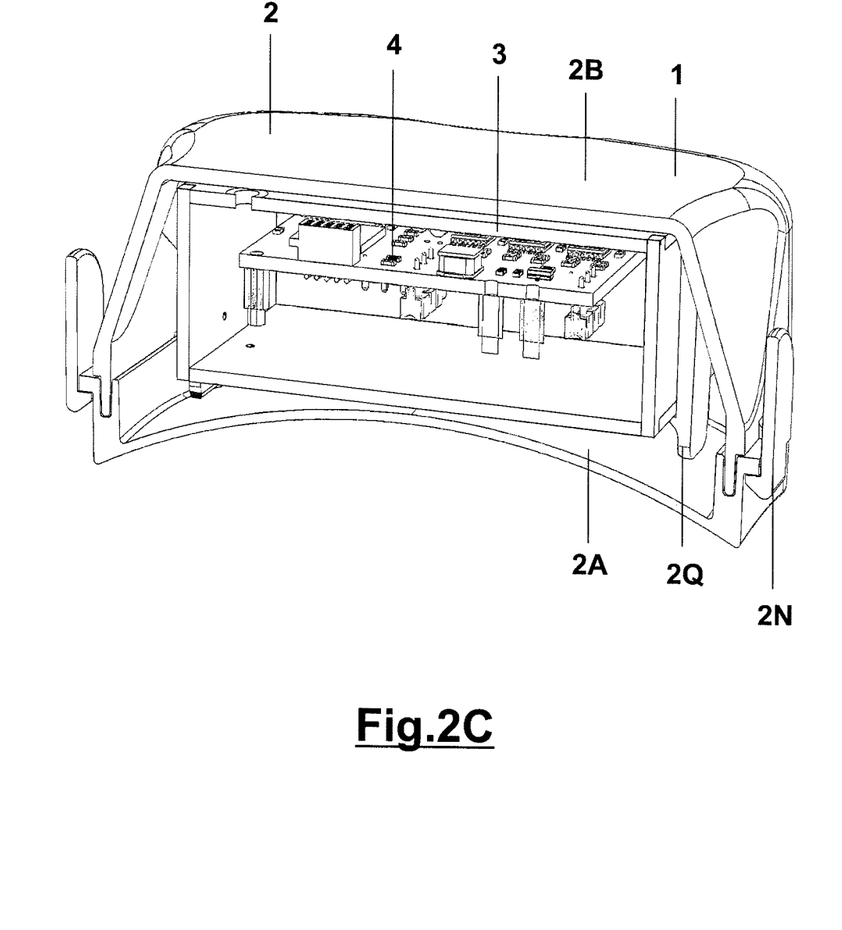
FIG. 2C is a sectional view of the three-dimensional electric field sensor in hard hats showing the internal components thereof.
Figure 2D:
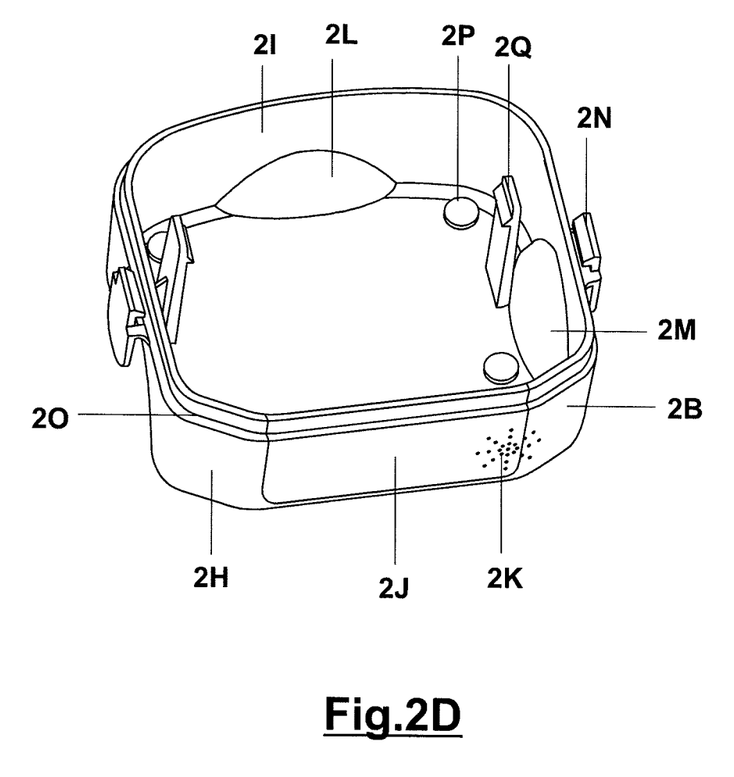
FIG. 2D is a perspective view of the cover of the three-dimensional electric field sensor in hard hats without the internal components thereof.
Figure 3A:
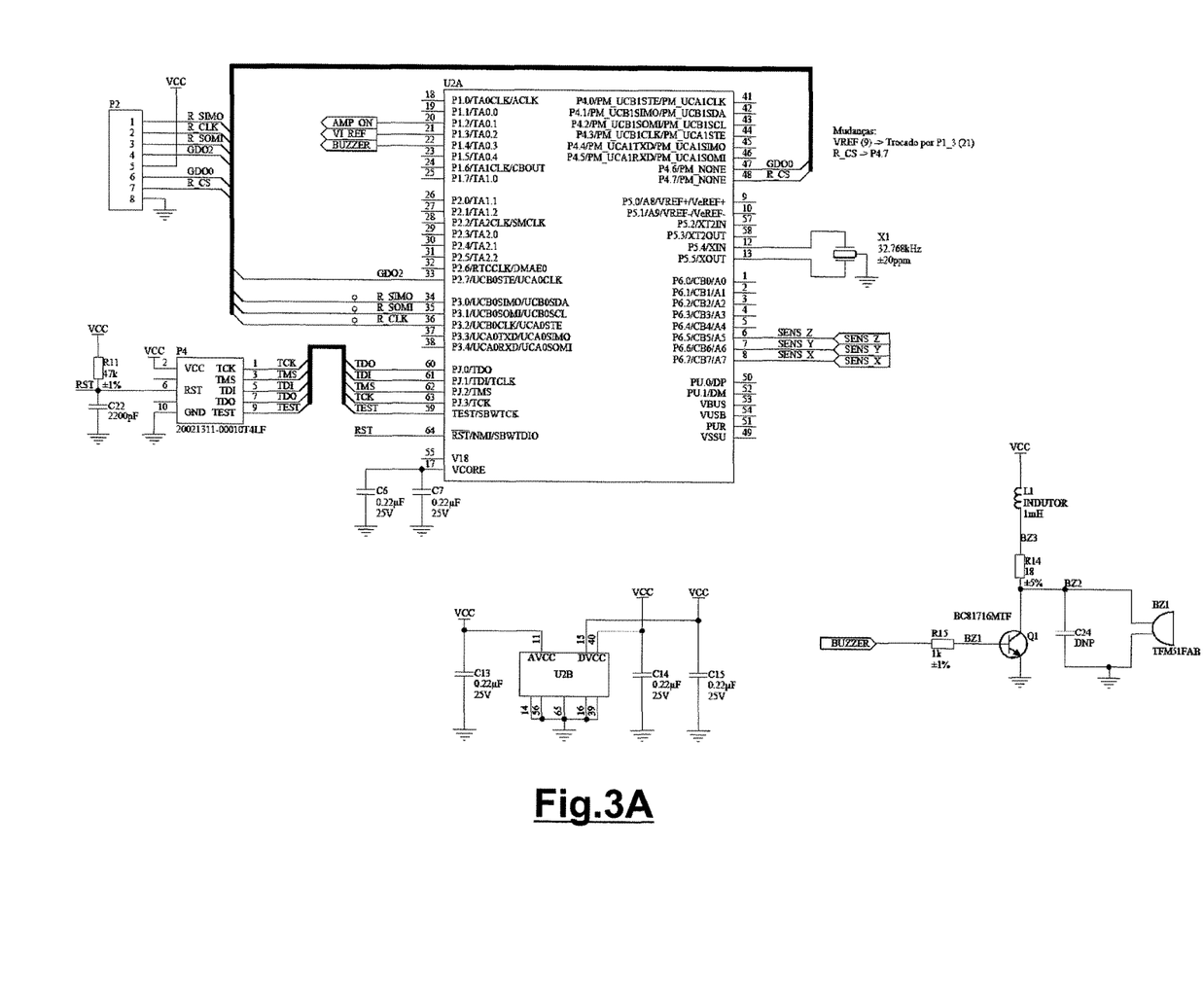
FIG. 3A is the wiring diagram of the electronic board processor of the three-dimensional electric field sensor in hard hats.
Figure 3B:
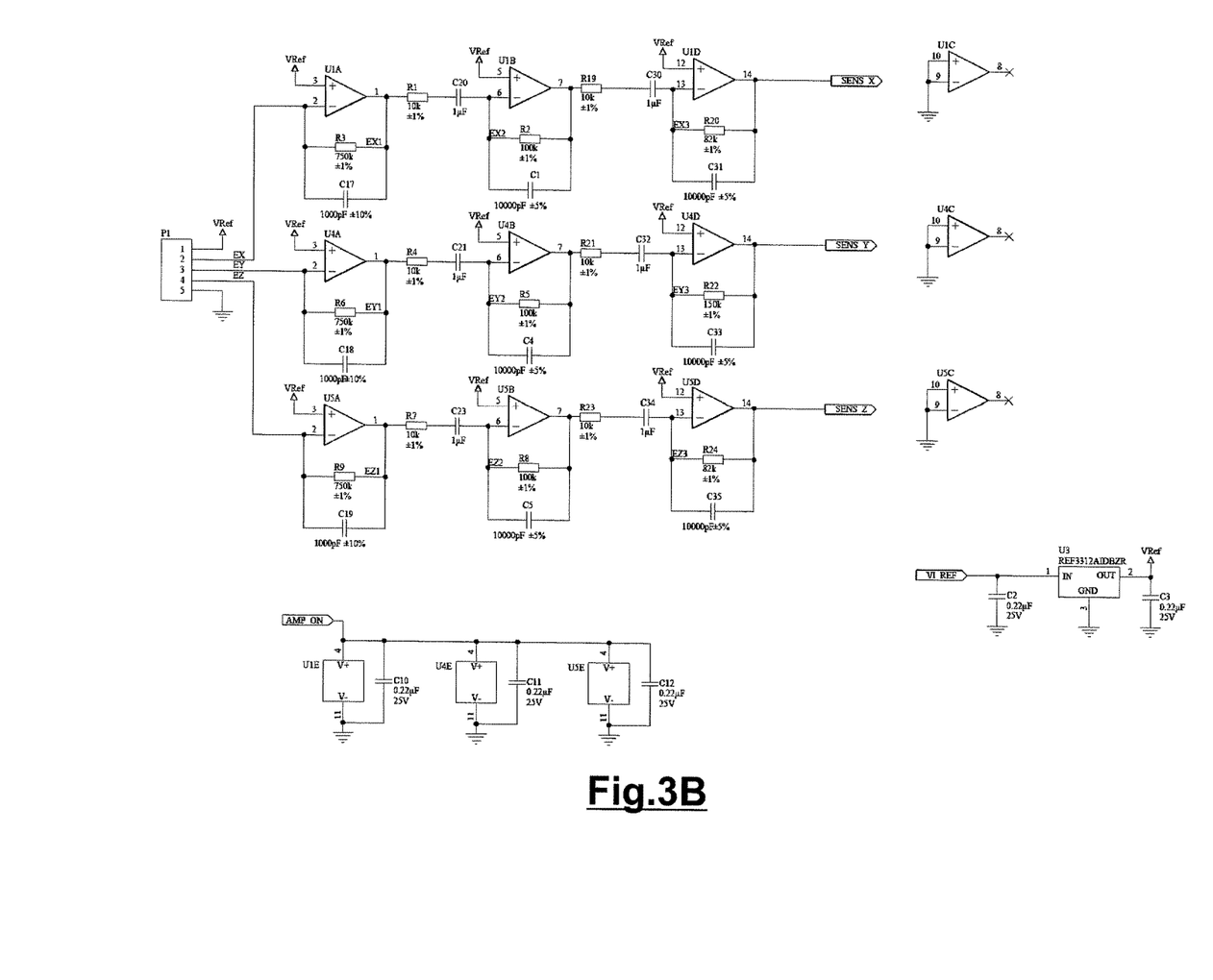
FIG. 3B is the wiring diagram of the electronic board analog circuits of the three-dimensional electric field sensor in hard hats.
Figure 4A:
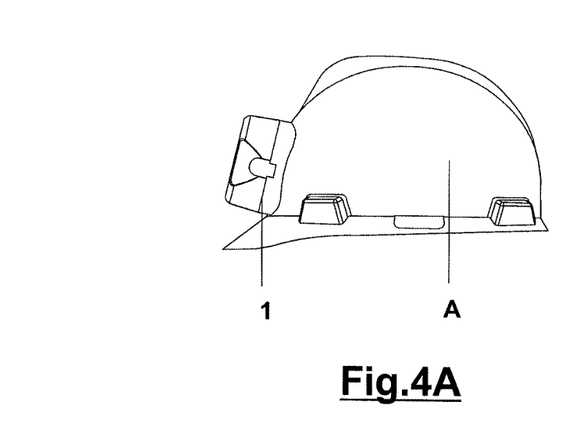
FIG. 4A is a side view of the three-dimensional electric field sensor in hard hats disposed therein.
Figure 4B:
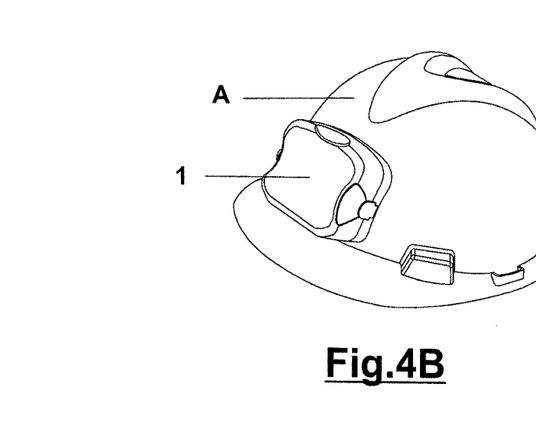
FIG. 4B is a perspective view of the three-dimensional electric field sensor in hard hats disposed therein.
Figure 4C:
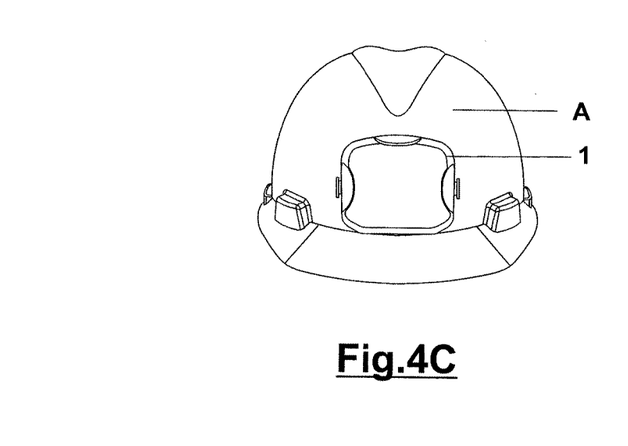
FIG. 4C is a front view of the three-dimensional electric field sensor in hard hats disposed therein.
Figure 4D:
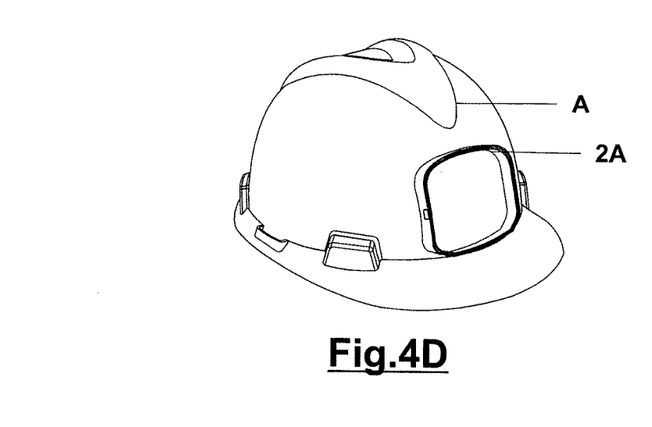
FIG. 4D is a perspective view of the base of the three-dimensional electric field sensor in hard hats disposed therein.

The base or hard hat face (2A) comprises two bevels (2C) of rectangular shapes and symmetrically arranged at the bottom-side ends of the base or hard hat face (2A), a curvature (2D) of convex shape horizontal, parallel and symmetrically arranged along the entire length of the top face of the base or hard hat face (2A), a recess (2E) of concave shape vertical, parallel and symmetrically arranged along the entire length of the rear face of the base or hard hat face (2A) as an adaptation to the front surface of the hard hat (A), a groove (2F) of modular shape vertical, perpendicular and symmetrically arranged around the entire length of the front ends of the base or hard hat face (2A) as a tongue and groove mechanism for the cover or shell face (2B) on the base or hard hat face (2A), and two protrusions (2G) of parallelepipedal shape, vertical, parallel and symmetrically centered at the rear side ends of the base or hard hat face (2A) as a locking for the cover or shell face (2B) on the base or hard hat face (2A).

The cover or shell face (2B) comprises two bevels (2H) of rectangular shapes symmetrically arranged at the bottom-side ends of the cover or shell face (2B) corresponding to the two bevels (2C), a curvature (2I) of convex shape horizontal, parallel and symmetrically arranged along the entire length of the cover or shell face (2B) top surface and corresponding to the curvature (2D), a small cover (2J) of rectangular shape horizontal, parallel and symmetrically centered on the underside of the cover or shell face (2B) as a direct access to the battery/adapter assembly or power supply (5), a set of holes (2K) of circular shape horizontal, parallel and symmetrically arranged on the underside of the small cover (2J) as a passageway for the sound emitted by the buzzer (6) from the inside of the three-dimensional electric field sensor (1), a recess (2L) of oblong shape horizontal, parallel and symmetrically centered on the top and front surfaces of the cover or shell face (2B), two recesses (2M) of semi-oblong shapes vertical, parallel and symmetrically centered on the side and front surfaces of the cover or shell face (2B), two rods (2N) of L-like shapes horizontal, perpendicular and symmetrically centered on the rear side ends of the cover or shell face (2B) and aligned with the protrusions (2G) as a locking for the cover or shell face (2B) in the base or hard hat face (2A) through its fastening to the protrusions (2G), a small recess (2O) of modular shape vertical, parallel and symmetrically arranged around the entire length of the rear ends of the cover or shell face (2B) with a tongued and grooved mechanism into the groove (2F) for the cover or shell face (2B) in the base or hard hat face (2A), four projections (2P) of cylindrical shapes horizontal, perpendicular and symmetrically spaced apart at the inner rear ends of the cover or shell face (2B) as a support and leveling for the inner shell or capacitive sensor (3), and two recesses (2Q) of inverted L-like shapes horizontal, perpendicular and symmetrically centered on the inner rear ends of the cover or shell face (2B) as fasteners for the inner shell or capacitive sensor (3) on the inside of the outer shell (2).

As the three-dimensional electric field sensor in hard hats has fully integrated components, it can be assembled and disassembled quickly, nothing comes loose or breaks off or gets warped, and a high performance and efficiency is achieved, combined with high durability and complete safety during use. Once fully integrated, sensor and hard hat, the components are completely locked and united, thus preventing them from loosening when in use, making the assembly fully available for the routine procedures to alert electric utility linemen to the exceedingly close proximity to medium voltage conductors in powerlines. The three-dimensional electric field sensor (1) can be thus used without concerns of any nature, mainly regarding the safety and durability of its components, as well as the safety of its users.

The three-dimensional electric field sensor in hard hats, more specifically the outer shell (2), features as specific advantages: it is made of polymeric, hydrophobic and flammable material; it is weather resistant, mainly rain; it has ultraviolet protection/resistance—anti-UV protection against sunlight exposure; it is dielectric resistant; it presents high durability in aging tests in laboratory conducted in weathering chambers; it has low specific gravity; and it is impact resistant according to the traction levels regulated by lab and field tests.

In view of the foregoing, the three-dimensional electric field sensor is an electromagnetic sensor that will be well received by electric utility companies and their service providers in general, since the three-dimensional electric field sensor in hard hats has many advantages, such as: great safety, reliability and flexibility in its application; great efficiency and performance due to its general conception; great comfort, convenience and safety for the users; great overall strength and durability, combined with low or no wear of the assembly as a whole; fully accessible costs which provides an optimum cost-benefit ratio; practical and safe use by any user; high range; low and practical general maintenance; proper and direct adaptation to different types of hard hats; high operating accuracy; fully compatible weight and overall dimensions; high operating ergonomics; high operating reliability; high compactness; low energy consumption; polymeric and hydrophobic material and the certainty of having a three-dimensional electric field sensor that fully meets the current rules and regulations as well as the basic conditions required to its application with safety, strength and ergonomics.

All such attributes classify the three-dimensional electric field sensor in hard hats as a fully versatile, efficient, practical and safe way to be applied in the most diverse types of hard hats and several types of conductors of the most diverse powerlines disposed in various types of locations, regardless of the general characteristics these may have, being also easy to use and handle, combined with great performance and excellent general characteristics; nevertheless, the sizes, dimensions and quantities may vary according to the needs of each application.

The invention claimed is:

1. A three-dimensional electric field sensor constructed and arranged to fit a hard hat, wherein the sensor is parallelepipedally-shaped and centrally located on a front face of the hard hat, and comprising:
   a) a front face and a rear face, the rear face facing towards and being affixed to the hard hat, and the front face facing outwardly away from the hard hat;
   b) an outer shell covering the sensor, having a symmetrical round-edged parallelepipedal shape, and fitting over the entire length of the three-dimensional electric field sensor, comprising;
      a parallelepipedally-shaped outer shell base (2A), having a rear face facing towards the hard hat and fitting over the entire length of the sensor rear face, a hollow front face; and
      a parallelepipedally-shaped outer shell cover (2B), having a front face and a hollow rear face facing towards the hard hat, the rear face fitting to the front face of the outer shell base;
   c) a parallelepipedally-shaped inner shell (3), being a capacitive sensor, forming a single unit, contained within the outer shell and located on the rear face of the outer shell cover (2B), the inner shell comprising:
      a parallelepipedally-shaped inner shell base (3A), having a hollow front face and a rear face; and
      a rectangular-shaped inner shell cover (3B) fitting atop the front face of the inner shell base (3A);
   d) a rectangular-shaped electronic board (4), vertical and centrally located inside the inner shell (3), the electronic board configured for assisting controlling of the sensor, and the inner shell shielding the board from magnetic and electronic field exposure;
   e) a parallelepipedally-shaped battery and adapter assembly (5) providing a power supply, located inside the outer shell (2) on a central lower surface of the outer shell cover (2B), the assembly comprising:
      a parallelepipedally-shaped adapter (5A) located between a lower surface of the rear face of the inner shell base (3A) and a lower surface of the rear face of the outer shell cover (2A);
      a cylindrically-shaped battery (5B), fitted horizontally and parallelly along and to a bottom side of the adapter (5A); and
   f) a cylindrically-shaped warning buzzer (6), fitted adjacent to the battery and adapter assembly, between a lower surface of the rear face of the inner shell base (3A) and a lower surface of the rear face of the outer shell cover (2A), the buzzer providing an audible warning sound when triggered by the sensor detecting proximity to medium voltage conductors.

2. The three-dimensional electric field sensor according to claim 1, wherein the outer shell base (2A) having a convex-shaped curvature (2D) along the entire length of an outer surface of the rear face, the outer shell base further comprising:

two symmetrical rectangular-shaped base bevels (2C), each base bevel located on an end of a bottom side of the outer shell base (2A);

a concave recess (2E) formed along the length of the outer surface of the rear face of the outer shell base (2A);

a modular-shaped groove (2F) perpendicular to the concave recess, running around the entire length of front ends of the outer shell base (2A); and two symmetrical parallelepipedally-shaped protrusions (2G), each protrusion centrally located on a front face end of the outer shell base (2A);

wherein the outer shell cover (2B) having a convex-shaped curvature (2I) along the entire length of a top surface of the rear face of the outer shell cover (2B), the convex-shaped curvature corresponding to the convex-shaped curvature (2D) of the outer shell base (2A), the outer shell cover further comprising:

two symmetrical rectangular-shaped cover bevels (2H), each base bevel located on an end of a bottom side of the outer shell cover (2B), the cover bevels corresponding to the base bevels (2C) of the outer shell base;

a rectangular-shaped cover (2J) centrally located on an underside of the outer shell cover (2B), and having multiple circular holes (2K) arranged on an underside of the rectangular-shaped cover (2J);

an oblong-shaped recess (2L) centrally located on a top end of the front face of the outer shell cover (2B);

two symmetrical semi-oblong shaped recesses (2M), each semi-oblong recess centrally located on a side end of the front face of the outer shell cover (2B);

two symmetrical L-shaped rods (2N), each rod centrally located on a side end of the front face of the outer shell cover (2B), and aligned with the protrusions (2G) on the outer shell base;

a modular-shaped recess (2O) running around the entire length of a rear end of the outer shell cover (2B), having a tongued and grooved mechanism fitting into the groove (2F);

four symmetrical cylindrically-shaped horizontal projections (2P), symmetrically spaced, one projection located at each corner of the rear face of the outer shell cover (2B); and two symmetrical inverted L-shaped horizontal projections (2Q), each projection centrally located at an inner side end of the rear face of the outer shell cover (2B).

3. The three-dimensional electric field sensor according to claim 1, wherein the sensor is comprised of polymeric and hydrophobic materials.

4. The three-dimensional electric field sensor according to claim 1, wherein the outer shell cover may be detached from the outer shell base, allowing removal of the sensor and allowing the hard hat to be used as a personal protective equipment.

\* \* \* \* \*